(12) United States Patent
Long

(10) Patent No.: US 12,256,536 B2
(45) Date of Patent: Mar. 18, 2025

(54) SEMICONDUCTOR BASE PLATE AND SEMICONDUCTOR DEVICE

(71) Applicant: CHANGXIN MEMORY TECHNOLOGIES, INC., Hefei (CN)

(72) Inventor: Qiang Long, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 409 days.

(21) Appl. No.: 17/662,891

(22) Filed: May 11, 2022

(65) Prior Publication Data

US 2023/0064989 A1  Mar. 2, 2023

Related U.S. Application Data

(63) Continuation of application No. PCT/CN2021/125530, filed on Oct. 22, 2021.

(30) Foreign Application Priority Data

Sep. 1, 2021 (CN) .......................... 202111020690.3

(51) Int. Cl.
*H10B 20/20* (2023.01)
*H10B 20/25* (2023.01)

(52) U.S. Cl.
CPC ............. *H10B 20/20* (2023.02); *H10B 20/25* (2023.02)

(58) Field of Classification Search
CPC ...................................................... H10B 20/25
See application file for complete search history.

(56) References Cited

U.S. PATENT DOCUMENTS

| 6,563,157 B2 | 5/2003 | Fukuzumi |
| 9,076,680 B2 | 7/2015 | Busch et al. |
| 9,209,194 B1 | 12/2015 | Ikeda |
| 2012/0153404 A1* | 6/2012 | Ahn ...................... H10B 20/25 257/402 |
| 2016/0190145 A1 | 6/2016 | Maekawa et al. |

FOREIGN PATENT DOCUMENTS

| CN | 1881616 A | 12/2006 |
| CN | 105742285 A | 7/2016 |
| CN | 104347629 B | 4/2017 |

OTHER PUBLICATIONS

International Search Report cited in PCT/CN2021/125530 mailed May 26, 2022, 8 pages.

* cited by examiner

*Primary Examiner* — Evren Seven
(74) *Attorney, Agent, or Firm* — Kilpatrick Townsend & Stockton LLP

(57) ABSTRACT

Embodiments of the present disclosure disclose a semiconductor base plate and a semiconductor device. An array region includes a primary memory cell. A peripheral region includes an antifuse memory cell. The antifuse memory cell and the primary memory cell are formed by a same process.

14 Claims, 7 Drawing Sheets

SEMICONDUCTOR BASE PLATE AND SEMICONDUCTOR DEVICE

CROSS-REFERENCE TO RELATED APPLICATIONS

This is a continuation of International Application No. PCT/CN2021/125530, filed on Oct. 22, 2021, which claims the priority to Chinese Patent Application No. 202111020690.3, titled "SEMICONDUCTOR BASE PLATE AND SEMICONDUCTOR DEVICE" and filed with China National Intellectual Property Administration (CNIPA) on Sep. 1, 2021. The entire contents of International Application No. PCT/CN2021/125530 and Chinese Patent Application No. 202111020690.3 are incorporated herein by reference.

TECHNICAL FIELD

The present disclosure relates to the technical field of semiconductors, and in particular to a semiconductor base plate and a semiconductor device.

BACKGROUND

With the continuous development of semiconductor technology and storage technology, electronic devices continue to develop towards miniaturization and integration. A dynamic random access memory (DRAM) is widely used in various electronic devices due to its high storage density and fast reading and writing speed. The DRAM is generally composed of multiple memory cells. Each memory cell generally includes a transistor structure and a capacitor. The capacitor stores data information, and the transistor structure controls the reading and writing of data information in the capacitor.

SUMMARY

According to some embodiments, a first aspect of the present disclosure provides a semiconductor base plate, including:
- a semiconductor substrate, including an array region and a peripheral region, where the array region includes a primary memory cell,
- the peripheral region includes an antifuse memory cell; and
- the antifuse memory cell and the primary memory cell formed by a same process.

According to some embodiments, a second aspect of the present disclosure provides a semiconductor device, including the foregoing semiconductor base plate.

DETAILED DESCRIPTION

Figure 1:
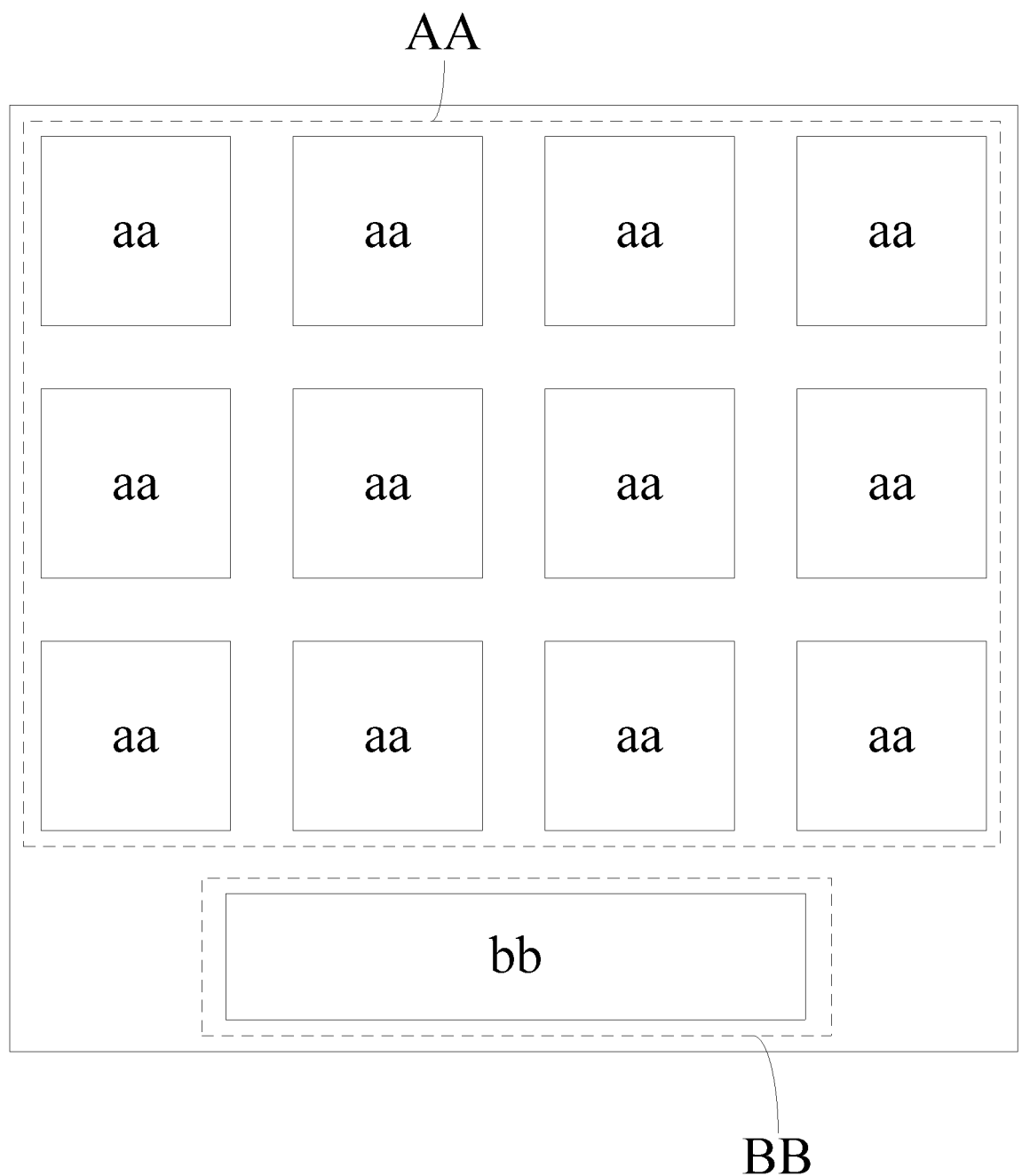
FIG. 1 is a top view of a semiconductor base plate according to an embodiment of the present disclosure.

In order to make the objectives, technical solutions, and advantages of the embodiments of the present disclosure clearer, the technical solutions in the embodiments of the present disclosure are clearly and completely described below with reference to the drawings in the embodiments of the present disclosure. Apparently, the described embodiments are some rather than all of the embodiments of the present disclosure. The embodiments in the present disclosure and features in the embodiments may be combined with each other in a non-conflicting manner. All other embodiments obtained by those of ordinary skill in the art based on the described embodiments of the present disclosure without creative efforts should fall within the protection scope of the present disclosure.

Unless otherwise defined, the technical or scientific terms used herein should have the usual meanings understood by those of ordinary skill in the field to which the present disclosure belongs. Terms such as "first" and "second" used herein do not denote any order, quantity or importance, but are merely intended to distinguish between different constituents. Terms such as "include" or "comprise" means that the element or item appearing before the term encompass the elements or items listed after the term and their equivalents, without excluding other elements or items. Terms such as "connected to" and "connected with" are not restricted to physical or mechanical connections, but may also include electrical connections, whether direct or indirect.

It should be noted that the dimension and the shape of each figure in the drawings do not reflect the real ratio, but are intended to illustrate the present disclosure. The same or similar reference numerals in the specification represent the same or similar elements or those having the same or similar functions.

With the continuous development and progress of integrated circuit technology, the requirements for performance such as yield rate and service life of semiconductor memory devices become increasingly high. Although the manufacturing process of the semiconductor memory device is constantly improved, some inevitable defects are still caused during the manufacturing of the semiconductor memory device, such that the memory cells in the array region of the semiconductor memory device cannot perform storing and reading correctly. Therefore, some redundant memory cells may be reserved in the design stage of the semiconductor memory device. In this way, when the semiconductor memory device is tested, if it is determined that a memory cell in the array region is damaged, the reserved memory cell can be used to replace the damaged memory cell in the array region, thereby repairing the poor memory cell in the array region.

However, the transistor in the reserved memory cell is usually a thick-oxide N-type metal oxide semiconductor field effect transistor (MOSFET), its dimension is generally 700*101 $nm^2$, and its pitch (a distance between two adjacent MOS transistors) is generally 204 nm. An area occupied by the thick-oxide N-type MOS transistor is a sum of its dimension and its pitch.

In the practical application, the gate performs the "switch functions" of turning off and turning on. Generally, a distance between the source and the drain of the thick-oxide N-type MOS transistor cannot be exceedingly small, otherwise, a channel distance is exceedingly short, and the "switch functions" of the gate are weakened. As a result, the source and the drain communicate, leading to short-channel effects. Therefore, if the length of the conductive channel of the thick-oxide N-type MOS transistor is reduced to the scale of dozens of nanometers or even a few nanometers, the short-channel effect occurs to the thick-oxide N-type MOS transistor. Therefore, considering the reliability and performance of the thick-oxide N-type MOS transistor, the device dimension of the thick-oxide N-type MOS transistor cannot be further reduced.

In the embodiments of the present disclosure, with reference to FIGS. 1, 2, 4A, and 4B, the semiconductor base plate may include a semiconductor substrate 10. For example, a material of the semiconductor substrate 10 may include a semiconductor of silicon, germanium, or silicon-on-insulator (SOI), or include a germanium silicon compound, silicon carbide or other known materials, for example, III and V compounds such as gallium arsenide and the like. Some dopant ions may also be implanted into the semiconductor substrate 10 according to design requirements to change electrical parameters. For example, the semiconductor substrate 10 may be a silicon substrate.

Figure 2:
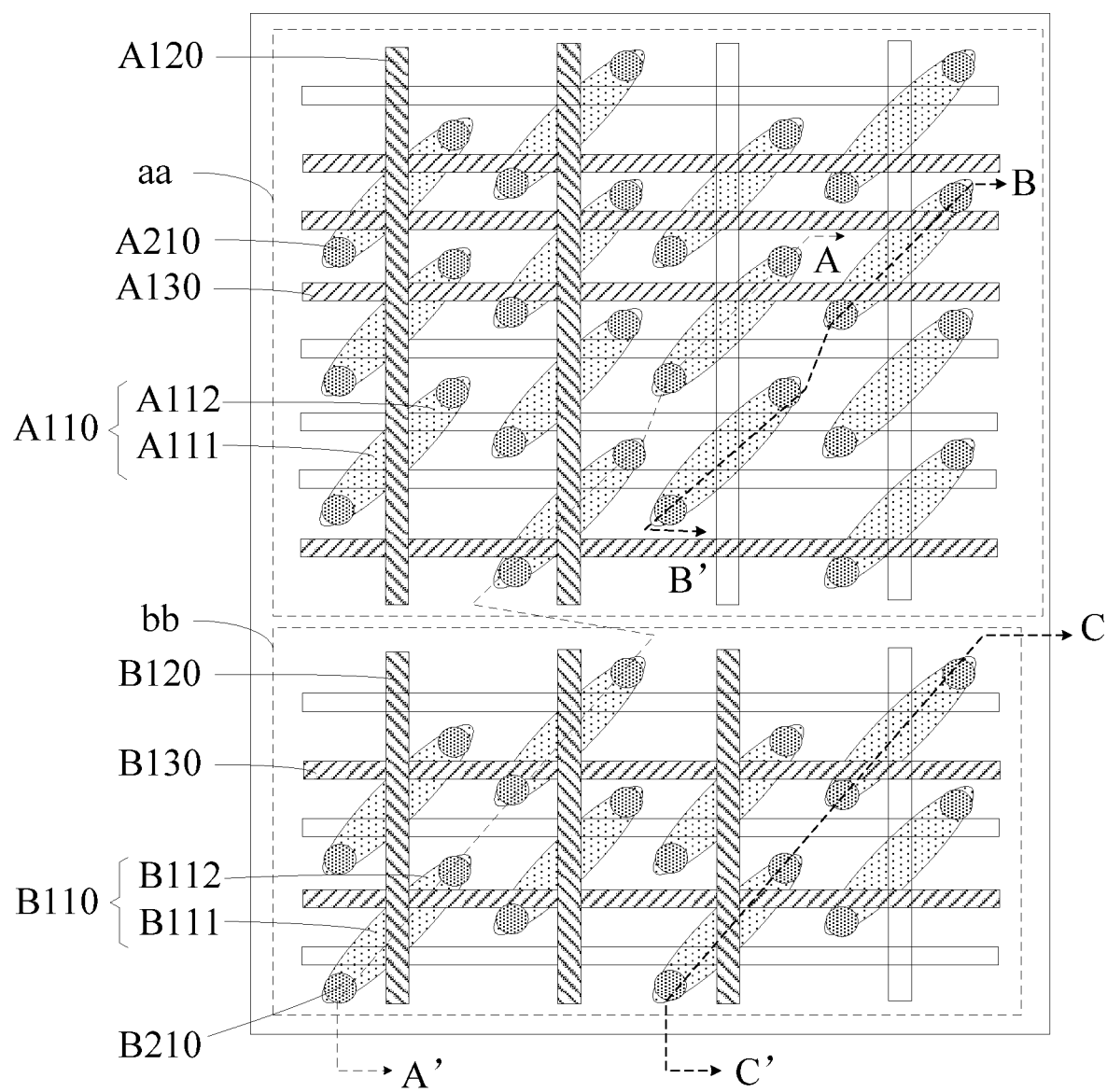
FIG. 2 is a top view of a part of the semiconductor base plate according to an embodiment of the present disclosure.
Figure 3:
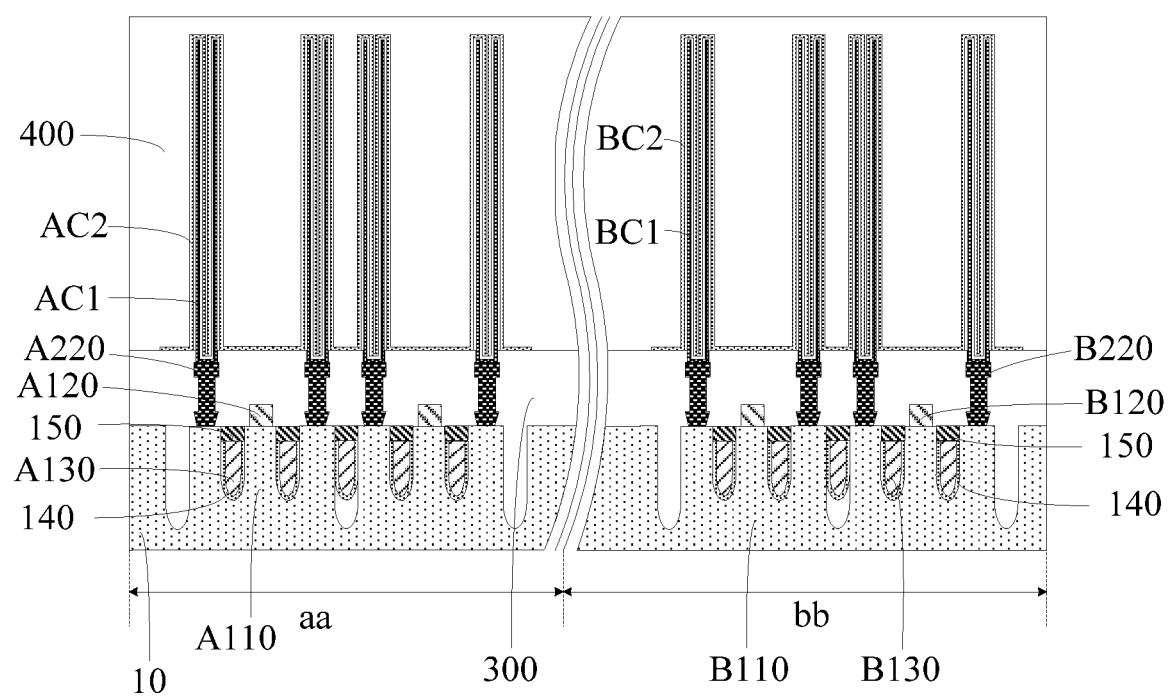
FIG. 3 is a cross-sectional view of the semiconductor base plate taken along AA' in FIG. 2.
Figure 4A:
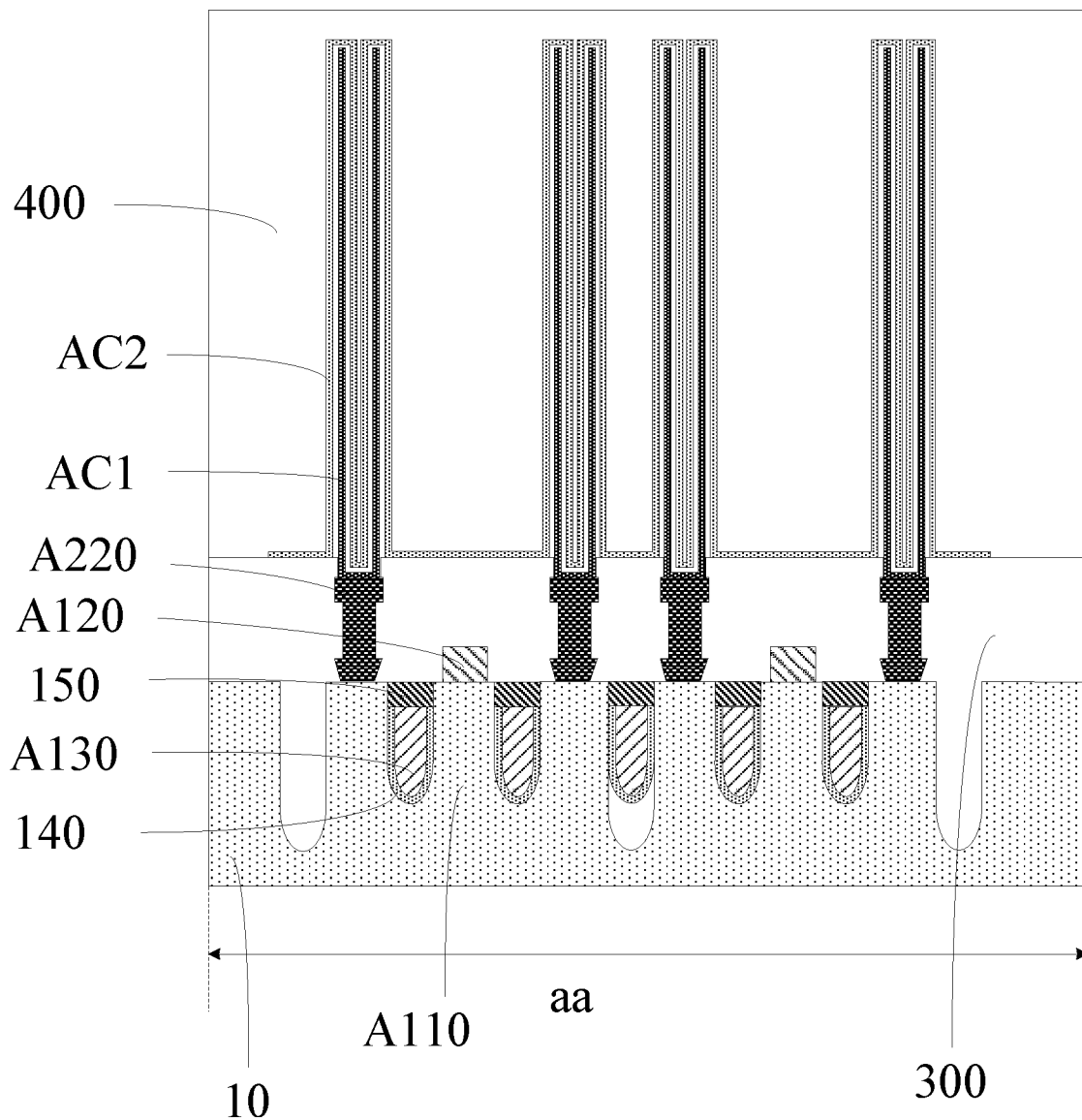
FIG. 4A is a cross-sectional view of the semiconductor base plate taken along BB' in FIG. 2.
Figure 4B:
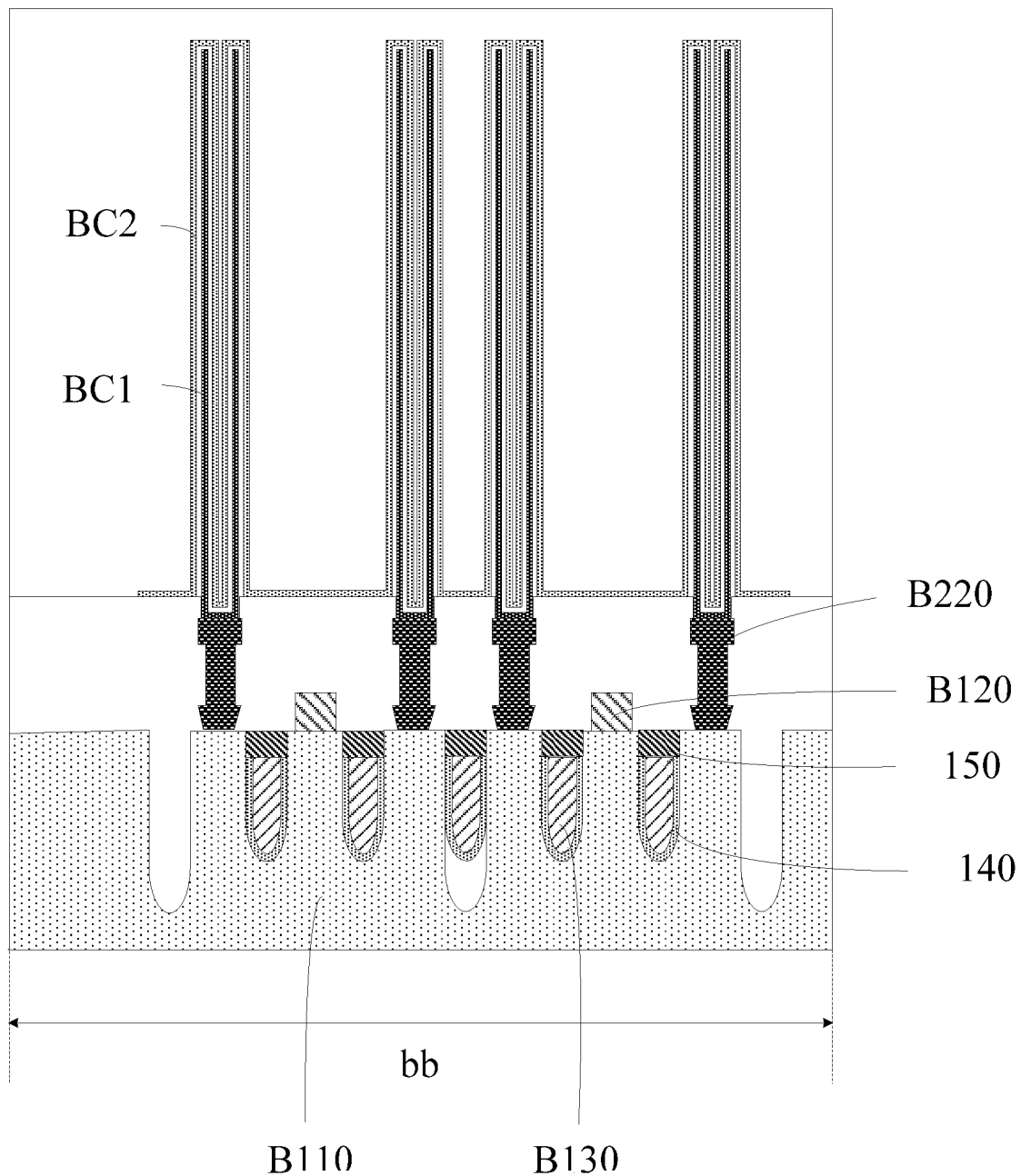
FIG. 4B is a cross-sectional view of the semiconductor base plate taken along CC' in FIG. 2.

In the embodiments of the present disclosure, with reference to FIGS. 1 to 3, the semiconductor substrate 10 may include an array region AA and a periphery region BB. The array region AA may include a plurality of memory regions aa. The memory region aa may include a primary memory cell, primary word lines A130, and primary bit lines A120. For example, the primary word line A130 may be buried in the semiconductor substrate 10. For example, the semiconductor substrate 10 is etched to form word line trenches. The primary word lines A130 are disposed in the word trenches, and the upper surfaces of the primary word lines A130 are lower than that of the semiconductor substrate 10. Then, a second isolation layer 150 is disposed on each of the primary word lines A130, such that the upper surfaces of the second isolation layers 150 are flush with that of the semiconductor substrate 10. For example, the primary word line A130 is made of one selected from the group consisting of tungsten, titanium, nickel, aluminum, platinum, titanium nitride, N-type polysilicon, and P-type polysilicon.

In the embodiment of the present disclosure, with reference to FIGS. 1 to 5B, the peripheral region BB may include a repair region bb. The repair region bb includes a plurality of antifuse memory cells BX, a plurality of secondary memory capacitors, secondary word lines B130, and secondary bit lines B120. For example, the secondary word lines B130 may be buried in the semiconductor substrate 10. For example, the semiconductor substrate 10 is etched to form word line trenches. The secondary word lines B130 are disposed in the word trenches, and the upper surfaces of the secondary word lines B130 are lower than that of the semiconductor substrate 10. Then, a second isolation layer 150 is disposed on each of the secondary word lines B130, such that the upper surfaces of the second isolation layers 150 are flush with that of the semiconductor substrate 10. For example, the secondary word line B130 is made of one selected from the group consisting of tungsten, titanium, nickel, aluminum, platinum, titanium nitride, N-type polysilicon, and P-type polysilicon.

In the embodiments of the present disclosure, an antifuse memory cell BX can be correspondingly connected to a secondary memory capacitor. For example, the secondary memory capacitor is electrically connected to the secondary bit line B120 by using a corresponding antifuse memory cell BX. For example, other circuits may be disposed between the antifuse memory cell BX and the secondary memory capacitor connected electrically, or them may be connected directly without the disposal of these circuits. When disposed between the antifuse memory cell BX and the secondary memory capacitor connected electrically, these circuit may have the same structure and operation principles of the circuit realizing the same function in the related art, which is not described in detail herein.

In the embodiments of the present disclosure, the structure of the antifuse memory cell may be formed by using the preparation process of the primary memory cell. Because the transistor and the capacitor in the primary memory cell formed by using the preparation process are small-sized, in the embodiment of the present disclosure, the transistor and the capacitor in the structure of the antifuse memory cell formed by using the preparation process of the primary memory cell are also small-sized. In this way, the dimension of the members in the antifuse memory cell can be decreased, to decrease the occupancy area of the peripheral region BB.

In the embodiment of the present disclosure, film layers having a same function in functional members in the antifuse memory cell and in the primary memory cell are formed by a one-time patterning process. In other words, when a member in the primary memory cell in the array region AA is formed, a member in the antifuse memory cell in the peripheral region BB can be also formed, such that no extra process steps for preparing the member in the antifuse memory cell are needed, thereby saving the process preparation time and improving the preparation efficiency. In addition, when the preparation process of the member in the primary memory cell in the array region AA is used to form the member in the antifuse memory cell in the peripheral region BB, the dimension of the member of the antifuse memory cell can be further decreased, to decrease the occupancy area of the peripheral region BB.

In some embodiments, the primary memory cell may include a primary control transistor and a primary memory capacitor A210 electrically connected thereto. The antifuse memory cell may include an antifuse control transistor BT and an antifuse memory capacitor electrically connected thereto. The primary control transistor and the antifuse control transistor are used as transistor members. The primary memory capacitor A210 can store data. The antifuse memory capacitor B210 has a characteristic of an antifuse member. For example, the array region AA has primary bit lines and primary word lines. A gate of the primary control transistor is electrically connected to the primary word line, the drain is electrically connected to the primary bit line, and the source is electrically connected to the primary memory capacitor A210. A voltage signal on the primary word line can control the primary control transistor to turn on or off, and then data information stored in the primary memory capacitor A210 is read by using the primary bit line, or the data information is written into the primary memory capacitor A210 by using the primary bit line for storage. In addition, the peripheral region BB has secondary bit lines and secondary word lines. A gate of the antifuse control transistor is electrically connected to the secondary word line, the drain is electrically connected to the secondary bit line, and the source is electrically connected to the antifuse memory capacitor B210. The voltage signal on the secondary word line can control the antifuse control transistor to turn on or off, and then the data information stored in the antifuse memory capacitor B210 is read by using the secondary bit line, or the data information is written into the antifuse memory capacitor B210 by using the secondary bit line for storage.

In the embodiments of the present disclosure, with reference to FIGS. 1 to 3, the secondary memory capacitor and the primary memory capacitor A210 may be of a same structure. In this way, when a primary memory cell is damaged, the secondary memory capacitor can be used to replace the primary memory capacitor A210 in the damaged primary memory cell. In addition, the secondary memory capacitor and the primary memory capacitor A210 are formed by using a same preparation process. In other words, the preparation process of the primary memory capacitor A210 in the array region AA may be used to form the secondary memory capacitor in the peripheral region BB, to not only decrease the process preparation difficulty, but decrease the dimension of secondary memory capacitor, thereby decreasing the occupancy area of the peripheral region BB.

In the embodiments of the present disclosure, with reference to FIG. 2, a first isolation layer 300 is provided between a layer where the primary memory capacitor A210 and the antifuse memory capacitor B210 are located and a layer where the primary control transistor and the antifuse control transistor are located. A primary through hole and a secondary through hole are formed in the first isolation layer 300. A primary contact pad A220 is disposed in the primary through hole, such that the primary memory capacitor A210 is electrically connected to the primary control transistor by using the primary contact pad A220 disposed in the primary through hole. In addition, a secondary contact pad B220 is disposed in the secondary through hole, such that the antifuse memory capacitor B210 is electrically connected to the antifuse control transistor by using the secondary contact pad B220 disposed in the secondary through hole. For example, the primary control transistor and the antifuse control transistor may be of a same structure, and the primary memory capacitor A210 and the antifuse memory capacitor B210 may be of a same structure. For example, to decrease the occupancy area of the capacitor, the primary memory capacitor A210 and the antifuse memory capacitor B210 can be disposed to be columnar.

In the embodiments of the present disclosure, with reference to FIG. 2, the primary through hole and the secondary through hole have a same pattern by using a same mask. In this way, the primary through hole and the secondary through hole can be kept as uniform as possible, to decrease the design difficulty of the devices.

In the embodiments of the present disclosure, with reference to FIG. 2, the primary contact pad A220 and the secondary contact pad B220 are formed by using a same preparation process.

In other words, when the primary contact pad A220 is formed in the array region AA, the secondary contact pad B220 can be formed in the peripheral region BB. Therefore, the process preparation difficulty can be decreased, and the secondary contact pad B220 can be prepared by using the process of preparing the primary contact pad A220, such that the dimensions of the formed secondary contact pad B220 and the primary contact pad A220 are approximately same, and the pitches of the secondary contact pad B220 and the primary contact pad A220 are approximately same, and occupancy areas of the secondary contact pad B220 and the primary contact pad A220 are approximately same, thereby decreasing the dimension of the secondary contact pad B220, and decreasing the occupancy area of the peripheral region BB.

In some examples, active regions A110 and B110 defined by shallow trench isolation regions are respectively formed in the array region and the peripheral region of the semiconductor substrate, and the shallow trench isolation region is filled with silicon oxide. Then, the semiconductor substrate is etched to form word line trenches passing through the active regions and the silicon oxide in the shallow trench isolation region regions. Then, the primary word line A130 and the secondary word line B130 can be formed by using a same patterning process. For example, gate insulating layers 140 cover the sidewalls of the word line trenches in the array region and the peripheral region. For example, the material of the gate insulating layer 140 may include one or more selected from the group consisting of silicon oxide, silicon nitride, oxynitride, silicon nitride, ONO, and a high dielectric material. For example, silicon oxide may cover the sidewalls of the word line trenches through an atomic layer deposition process to form the gate insulating layers 140. Then, by using a same mask, through a chemical vapor deposition process, a physical vapor deposition process, an atomic layer deposition process, a high-density plasma chemical vapor deposition process, a metal organic chemical vapor deposition process, a plasma-enhanced chemical vapor deposition process or another proper deposition process, a pattern of the primary word line A130 is formed in a word line trench in the array region, and a pattern of the secondary word line B130 is formed in the word line trench of the peripheral region BB. Then, a second isolation layer 150 is disposed on a word line buried in each of the word line trenches, and the top surfaces of the formed second isolation layers 150 are flush with that of the semiconductor substrate 10.

It should be noted that the word line may serve as the gate of the transistor, and the source/drain region of the transistor may be located in the active region at two sides of the word line. For example, one of the source/drain regions, such as a source/drain region between two word lines, may serve as a source of the corresponding transistor, and the other source/drain region, such as a source/drain region between the word line and the shallow trench isolation region, may serve as a drain of the corresponding transistor. For example, the primary word line A130 may serve as the gate of the primary control transistor. A source/drain region A111 (for example, a region covered by the primary bit line A120) between two primary word lines A130 may serve as the source of the primary control transistor. The source/drain region A112 between the primary word line A130 and the shallow trench isolation region may serve as a drain of the primary control transistor. The secondary word line B130 may serve as the gate of the antifuse control transistor. A source/drain region B111 (for example, a region covered by the secondary bit line B120) between two secondary word lines B130 may serve as the source of the antifuse control transistor. The source/drain region B112 between the secondary word line B130 and the shallow trench isolation region may serve as the drain of the antifuse control transistor.

Generally, if the primary control transistor formed in the array region AA is in a dimension of about $116*62/2$ nm$^2$, and its pitch (a distance between two adjacent primary control transistors) is about 55 nm, the occupancy area of the primary control transistor is a sum of its dimension and its pitch. In the embodiments of the present disclosure, film layers having a same function in the primary control transistor and in the antifuse control transistor are formed by a one-time patterning process, such that the antifuse control transistor in the peripheral region is formed while the primary control transistor in the array region AA is formed. Therefore, the process preparation difficulty can be decreased, and the antifuse control transistor can be prepared by using the process of preparing the primary control transistor, such that dimensions of the formed antifuse control transistor and the primary control transistor are approximately same, and pitches of the antifuse control transistor and the primary control transistor are approximately same, and the occupancy areas of the antifuse control transistor and the primary control transistor are approximately same, thereby decreasing the dimension of the antifuse control transistor, and decreasing the occupancy area of the peripheral region BB.

In the process of manufacturing the semiconductor base plate, film layers in the transistor and the memory capacitor are generally manufactured with a corresponding mask, which is used to form required circuit patterns required by the film layers in the transistor and the memory capacitor. For example, in the process of manufacturing the semiconductor base plate, a mask pattern corresponding to the required circuit pattern is formed first on the mask. Then, the mask pattern may be used as a barrier structure, and a film layer that is not blocked by the mask pattern is removed through an etching process, thereby forming the required circuit pattern. In the embodiments of the present disclosure, film layers having a same function in the antifuse control transistor and in the primary control transistor can be formed by using a same mask. In this way, patterns of film layers with a same function can be formed in the antifuse control transistor and the primary control transistor by using the same mask, to decrease a quantity of the masks used, thereby decreasing the production costs.

In some examples, film layers having a same function in the antifuse control transistor and in the primary control transistor can have a same pattern by using a same mask. Because the processes for preparing the masks are relatively uniform, the dimensions of the mask patterns formed on the mask are also uniform. After the mask is used, circuit patterns with a relatively uniform size can be obtained. In addition, because the process for preparing the pattern of the mask of the primary memory cell is mature, the antifuse memory cell is prepared by using the prepared pattern of the mask of the primary memory cell, without additionally designing a new mask, thereby decreasing the difficulty of designing a new mask and decreasing the preparation costs.

The transistor includes a gate, an active region, a source, and a drain. In some embodiments, a gate of the primary control transistor and a gate of the antifuse control transistor have a same pattern by using a same mask. In addition, an active region of the primary control transistor and an active region of the antifuse control transistor have a same pattern by using a same mask. Moreover, a source of the primary control transistor and a source of the antifuse control transistor have a same pattern by using a same mask. Further, a drain of the primary control transistor and a drain of the antifuse control transistor have a same pattern by using a same mask. In this way, the structures of the primary control transistor and the antifuse control transistor can be kept uniform, such that the dimensions of the primary control transistor and the antifuse control transistor can be kept uniform, and when data reading and storing are controlled, the transistor characteristics of the primary control transistor and the antifuse control transistor can be kept as uniform as possible, thereby after the primary control transistor is replaced by the antifuse control transistor, decreasing the error rate of the data reading and storing, and improving the stability of data reading and storing.

In the embodiments of the present disclosure, the plurality of primary bit lines and the plurality of secondary bit lines are formed by using a same preparation process. For example, the primary bit lines A120 and the secondary bit lines B120 can be formed by a one-time patterning process. For example, the primary bit lines A120 and the secondary bit lines B120 can have a same pattern by using a same mask. For example, the materials of the primary bit line A120 and the secondary bit line B120 include tungsten.

In the embodiments of the present disclosure, film layers having a same function in the primary memory capacitor A210 and in the antifuse memory capacitor B210 are formed by a one-time patterning process. In other words, the antifuse memory capacitor B210 can be formed in the peripheral region while the primary memory capacitor A210 is formed in the array region AA. Therefore, the process preparation difficulty can be decreased, and the antifuse memory capacitor B210 can be prepared by using the process of preparing the primary memory capacitor A210, such that the dimensions of the formed antifuse memory capacitor B210 and the primary memory capacitor A210 are approximately same, and the pitches of the antifuse memory capacitor B210 and the primary memory capacitor A210 are approximately same, and occupancy areas of the antifuse memory capacitor B210 and the primary memory capacitor A210 are approximately same, thereby decreasing the size of the antifuse memory capacitor B210, and decreasing the occupancy area of the peripheral region BB.

In the embodiments of the present disclosure, film layers having a same function in the primary memory capacitor A210 and in the antifuse memory capacitor B210 are formed by using a same mask. In this way, patterns of film layers with a same function can be formed in the antifuse memory capacitor B210 and the primary memory capacitor A210 by using the same mask, to decrease a quantity of the masks used, thereby decreasing the production costs.

Generally, the capacitor may include two electrode plates that are opposite to each other and a dielectric layer located between them. In some examples, the primary memory capacitor A210 includes a primary first electrode plate AC1 and a primary second electrode plate AC2, and a dielectric layer located between them. The primary first electrode plate AC1 is electrically connected to the primary control transistor through the primary through hole. During the application process, a voltage signal on the primary word line can control the primary control transistor to turn on or off, and then data information stored in the primary memory capacitor A210 is read by using the primary bit line, or the data information is written into the primary memory capacitor A210 by using the primary bit line for storage.

In some examples, the antifuse memory capacitor B210 includes a secondary first electrode plate BC1 and a secondary second electrode plate BC2, and a dielectric layer located between them. The secondary first electrode plate BC1 is electrically connected to the antifuse control transistor through the secondary through hole.

Figure 5A:
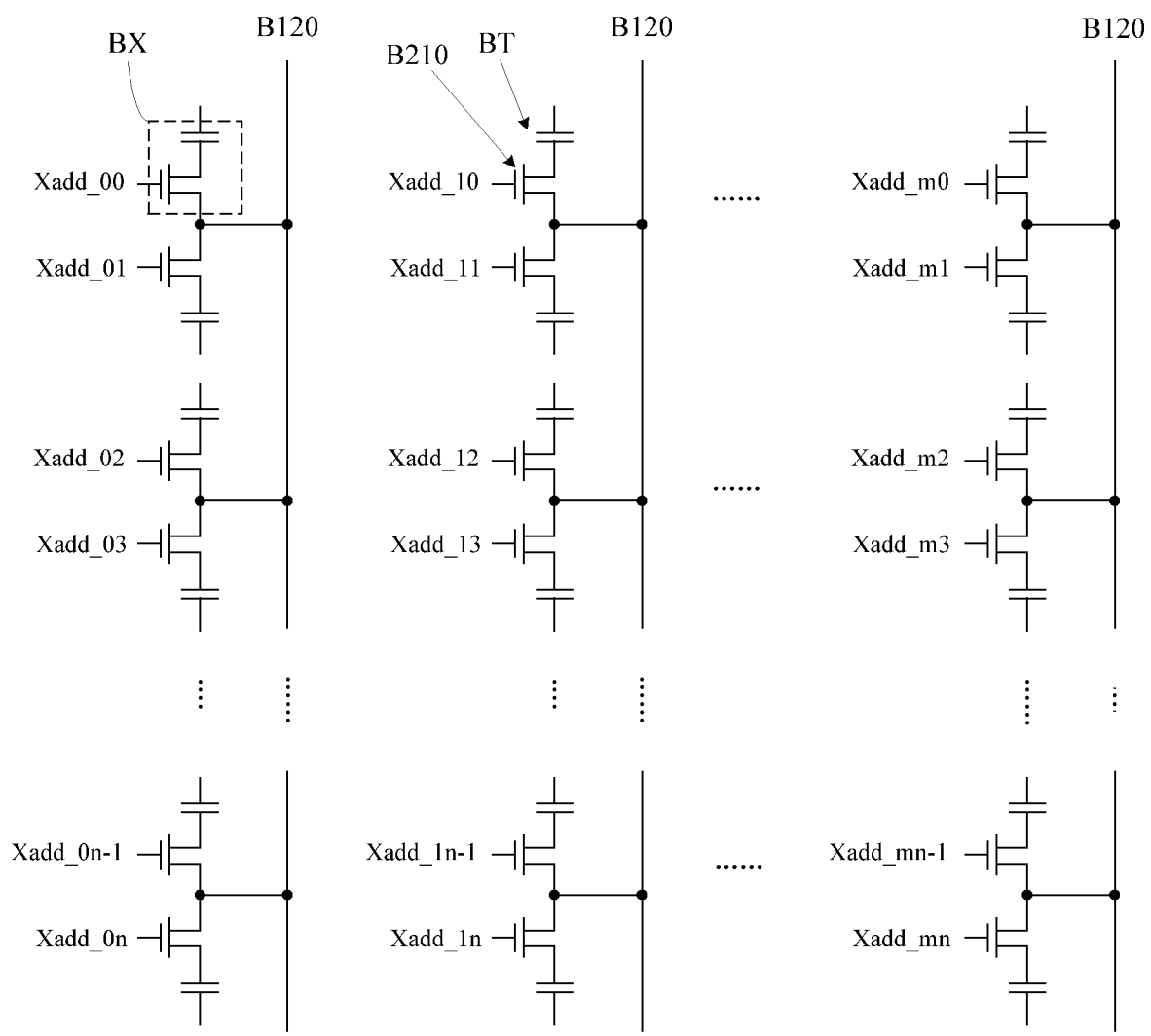
FIG. 5A is a schematic diagram of some equivalent circuits of the semiconductor base plate in the peripheral region according to an embodiment of the present disclosure.
Figure 5B:
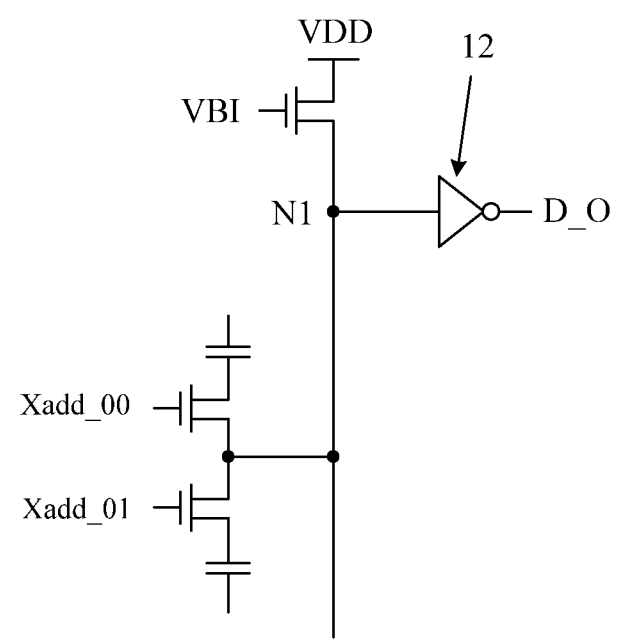
FIG. 5B is a schematic diagram of some other equivalent circuits of the semiconductor base plate in the peripheral region according to an embodiment of the present disclosure.

With reference to FIGS. 5A and 5B, if the antifuse memory cell is burned during the programming, it can be converted from the unstored state to the stored state, thereby decreasing the path resistance to a small value (for example, tens of kiloohms to hundreds of kiloohms). When the antifuse memory cell is selected, a pass current flows through the equivalent resistance in the stored state, to generate a lower voltage on a node N1, causing a logic gate 12 to output a signal D_O of a high level. On the contrary, if the antifuse memory cell is not burned during the programming, the equivalent resistance of the antifuse memory cell in the pass is relatively large (for example, several megaohms to hundreds of megaohms), and a voltage drop generated by a fixed circuit in the path exceeds the toggle point of the logic gate 12, causing the logic gate 12 to output 10 the signal D_O of a low level.

In some examples, with reference to FIGS. 5A and 5B, when data is written or stored into the secondary memory capacitor connected to the antifuse memory capacitor B210, a voltage may be applied to the gate of the antifuse control transistor BT, to turn on the antifuse control transistor B210. At the same time, a high voltage is applied to the secondary bit line B120 electrically connected to the antifuse control transistor B210 that is turned on, the secondary second electrode plate BC2 is connected to the secondary memory capacitor, and a high voltage exists between the secondary first electrode plate BC1 and the secondary second electrode plate BC2 of the antifuse memory capacitor B210. If the high voltage is large enough, it can break down the dielectric layer (for example, a silicon oxide layer) between the secondary first electrode plate BC1 and the secondary second electrode plate BC2, such that the resistance of the channel becomes quite small. For example, the stored signal is defined as 0, the secondary memory capacitor will store 0. If the high voltage is not large enough to break down the dielectric layer (for example, the silicon oxide layer), the channel resistance becomes quite large. For example, the stored signal is defined as 1, the secondary memory capacitor will store 1. It should be noted that the specific value of the high voltage in this section may be basically the same as that in the related art, which is not limited herein.

When data is read in the secondary memory capacitor connected to the antifuse memory capacitor B210, a voltage may be applied to the gate of the antifuse control transistor, to turn on the antifuse control transistor. At the same time, a voltage of 1 V to 1.2 V is applied to the secondary bit line B120 electrically connected to the antifuse control transistor that is turned on, and the secondary second electrode plate is connected to the secondary memory capacitor BC2. If the dielectric layer (for example, the silicon oxide layer) is broke down, the channel resistance becomes quite small (for example, 1 kΩ). If the circuit that measures the voltage in the channel further has a divider resistance, the voltage of the measured divider resistance (for example, 10 kΩ) is quite large, and what is stored in the secondary memory capacitor connected to the antifuse memory capacitor B210 is 0. On the contrary, if the dielectric layer (for example, the silicon oxide layer) is not broke down, the channel resistance becomes quite large (for example, 100 kΩ). If the circuit that measures the voltage in the channel further has a divider resistance, the voltage of the measured divider resistance is quite large, and what is stored in the secondary memory capacitor connected to the antifuse memory capacitor B210 is 1.

It should be noted that, in FIG. 5A, n represents a quantity of rows, and m represents a quantity of columns. In addition, the specific values of n and m may be determined according to specific application requirements, which is not limited herein.

In some examples, the dielectric layer of the antifuse memory capacitor B210 and the dielectric layer of the primary memory capacitor A210 may be film layers disposed entirely.

In some examples, after the primary bit lines A120 and the secondary bit lines B120 are formed, through a chemical vapor deposition process, a physical vapor deposition process, an atomic layer deposition process, a high-density plasma chemical vapor deposition process, a metal organic chemical vapor deposition process, a plasma-enhanced chemical vapor deposition process or another proper deposition process, a first isolation layer 300 is formed in the array region and the peripheral region. Then, the primary through hole and the secondary through hole are formed in the first isolation layer 300 by using an etching process. Then, through the chemical vapor deposition process, the physical vapor deposition process, the atomic layer deposition process, the high-density plasma chemical vapor deposition process, the metal organic chemical vapor deposition process, the plasma-enhanced chemical vapor deposition process or another proper deposition process, the primary contact pad A220 is formed in the primary through hole and a secondary contact pad B220 is formed in the secondary through hole.

Then, through the chemical vapor deposition process, the physical vapor deposition process, the atomic layer deposition process, the high-density plasma chemical vapor deposition process, the metal organic chemical vapor deposition process, the plasma-enhanced chemical vapor deposition process or another proper deposition process, a first electrode plate mask layer is formed. Then, the first electrode plate mask layer is etched through an etching process to form the primary first electrode plate AC1 and the secondary first electrode plate BC1.

Then, through the chemical vapor deposition process, the physical vapor deposition process, the atomic layer deposition process, the high-density plasma chemical vapor deposition process, the metal organic chemical vapor deposition process, the plasma-enhanced chemical vapor deposition process or another proper deposition process, a dielectric layer is formed on the primary first electrode plate AC1 and a dielectric layer is formed on the secondary first electrode plate BC1.

Then, through the chemical vapor deposition process, the physical vapor deposition process, the atomic layer deposition process, the high-density plasma chemical vapor deposition process, the metal organic chemical vapor deposition process, the plasma-enhanced chemical vapor deposition process or another proper deposition process, the primary second electrode plate AC2 and the secondary second electrode plate BC2 are respectively formed on the dielectric layers. For example, the primary second electrode plate AC2 may be a film layer disposed entirely. For example, the secondary second electrode plate BC2 may be also a film layer disposed entirely.

Then, through the chemical vapor deposition process, the physical vapor deposition process, the atomic layer deposition process, the high-density plasma chemical vapor deposition process, the metal organic chemical vapor deposition process, the plasma-enhanced chemical vapor deposition process or another proper deposition process, a second isolation layer 150 is formed on the primary second electrode plate AC2 and a second isolation layer 150 is formed on the secondary second electrode plate BC2.

In some embodiments of the present disclosure, the peripheral region BB further includes a repair control circuit. The repair control circuit is connected to the antifuse memory cell. In addition, the repair control circuit is connected to the secondary memory capacitor by using the antifuse memory cell. Moreover, when it is determined that a primary memory cell in the array region is damaged, the repair control circuit is configured to control a corresponding antifuse memory cell to operate, to replace the damaged primary memory cell with the secondary memory capacitor connected electrically. For example, when a damaged primary memory cell is determined in the array region AA, a specific position (for example, a row and a column in the array region) of the damaged primary memory cell can be determined, such that through programming, the repair control circuit controls the antifuse memory cell to form a path, to replace the damaged primary memory cell in the position with the secondary memory capacitor electrically connected to the antifuse memory cell forming the path.

An embodiment of the present disclosure further provides a semiconductor device. The semiconductor device may include the foregoing semiconductor base plate provided by the embodiments of the present disclosure. The principle of the semiconductor device to solve the problem is similar to that of the foregoing semiconductor base plate. Therefore, the implementation of the semiconductor device can refer to the implementation of the foregoing semiconductor base plate. Details are not described herein again.

During a specific implementation, in the embodiment of the present disclosure, the semiconductor base plate can be applied to a semiconductor member (for example, a DRAM). The semiconductor device may include a semiconductor member. In addition, the semiconductor device may be a product or component with a storing function. Other indispensable components of the semiconductor device are understandable by those of ordinary skill in the art, and therefore are not described in detail herein, and are not construed as a limitation to the present disclosure either.

Apparently, those skilled in the art can make various modifications and variations to the present disclosure without departing from the spirit and scope of the present disclosure. The present disclosure is intended to cover these modifications and variations provided that they fall within the scope of protection defined by the claims of the present disclosure or equivalents thereof.

The invention claimed is:

1. A semiconductor base plate, comprising:
a semiconductor substrate, comprising an array region and a peripheral region, wherein
the array region comprises a primary memory cell;
the peripheral region comprises an antifuse memory cell and secondary memory capacitors, one of the secondary memory capacitors is electrically connected to the antifuse memory cell;
the peripheral region further comprises a repair control circuit, the repair control circuit is connected to the antifuse memory cell, and the repair control circuit is connected to the secondary memory capacitor by using the antifuse memory cell, and when it is determined that a primary memory cell in the array region is damaged, the repair control circuit is configured to control a corresponding antifuse memory cell to operate, to replace the damaged primary memory cell with the secondary memory capacitor connected electrically; and
the antifuse memory cell and the primary memory cell formed by a same process.

2. The semiconductor base plate according to claim 1, wherein
film layers having a same function in functional members in the antifuse memory cell and in the primary memory cell are formed by a one-time patterning process.

3. The semiconductor base plate according to claim 2, wherein
the primary memory cell comprises a primary control transistor; and the antifuse memory cell comprises an antifuse control transistor; and
film layers having a same function in the primary control transistor and in the antifuse control transistor are formed by a one-time patterning process.

4. The semiconductor base plate according to claim 3, wherein
a gate of the primary control transistor and a gate of the antifuse control transistor have a same pattern by using a same mask;
an active region of the primary control transistor and an active region of the antifuse control transistor have a same pattern by using a same mask;
a source of the primary control transistor and a source of the antifuse control transistor have a same pattern by using a same mask; and
a drain of the primary control transistor and a drain of the antifuse control transistor have a same pattern by using a same mask.

5. The semiconductor base plate according to claim 3, wherein
the primary memory cell further comprises a primary memory capacitor; and the antifuse memory cell further comprises an antifuse memory capacitor;
a first isolation layer is provided between a layer in which the primary memory capacitor and the antifuse memory capacitor are located and a layer in which the primary control transistor and the antifuse control transistor are located; the first isolation layer is provided with a primary through hole and a secondary through hole; and the primary memory capacitor is electrically connected to the primary control transistor through the primary through hole, and the antifuse memory capacitor is electrically connected to the antifuse control transistor through the secondary through hole; and
film layers having a same function in the primary memory capacitor and in the antifuse memory capacitor are formed by using a same mask.

6. The semiconductor base plate according to claim 5, wherein
the primary memory capacitor comprises a primary first electrode plate and a primary second electrode plate; and the primary first electrode plate is electrically connected to the primary control transistor through the primary through hole;
the antifuse memory capacitor comprises a secondary first electrode plate and a secondary second electrode plate; and the secondary first electrode plate is electrically connected to the antifuse control transistor through the secondary through hole; and
the primary first electrode plate and the secondary first electrode plate have a same pattern by using a same mask.

7. The semiconductor base plate according to claim 6, wherein
the primary memory capacitor and the antifuse memory capacitor are columnar.

8. The semiconductor base plate according to claim 6, wherein
the primary through hole and the secondary through hole have a same pattern by using a same mask.

9. The semiconductor base plate according to claim 6, further comprising:
   a primary contact pad located in the primary through hole and a secondary contact pad located in the secondary through hole;
   the primary first electrode plate is electrically connected to the primary control transistor by using the primary contact pad; and
   the secondary first electrode plate is electrically connected to the antifuse control transistor by using the secondary contact pad.

10. The semiconductor base plate according to claim 9, wherein
   the primary contact pad and the secondary contact pad are formed by using a same preparation process.

11. The semiconductor base plate according to claim 5, wherein
   the array region comprises a plurality of primary bit lines, and the peripheral region comprises a plurality of secondary bit lines; and
   the plurality of primary bit lines and the plurality of secondary bit lines are formed by using a same preparation process.

12. The semiconductor base plate according to claim 11, wherein
   the plurality of primary bit lines and the plurality of secondary bit lines have a same pattern by using a same mask.

13. The semiconductor base plate according to claim 5, wherein
   the secondary memory capacitor and a primary memory capacitor of the primary memory cell are of a same structure.

14. A semiconductor device, comprising
   the semiconductor base plate according to claim 1.

* * * * *